United States Patent [19]

Ishizuka et al.

[11] Patent Number: 5,742,157
[45] Date of Patent: Apr. 21, 1998

[54] OPTICAL FIBER MAGNETIC-FIELD SENSOR

[75] Inventors: Satoshi Ishizuka, Hirakata; Hisashi Minemoto, Otsu; Nobuki Itoh, Katano, all of Japan

[73] Assignee: Matsushita Electric Industrial Co., Ltd., Osaka, Japan

[21] Appl. No.: 751,683

[22] Filed: Nov. 18, 1996

[30] Foreign Application Priority Data

Nov. 17, 1995 [JP] Japan .................. 7-299379

[51] Int. Cl.⁶ .................................................. G01R 31/00
[52] U.S. Cl. ........................... 324/96; 324/753; 324/244.1
[58] Field of Search ........................ 324/96, 753, 244.1; 359/245, 263, 265, 261, 280

[56] References Cited

U.S. PATENT DOCUMENTS

| | | | |
|---|---|---|---|
| 4,843,232 | 6/1989 | Emo et al. | 250/225 |
| 4,947,035 | 8/1990 | Zook et al. | 250/225 |
| 5,192,862 | 3/1993 | Rudd | 250/227.21 |
| 5,212,446 | 5/1993 | Itoh et al. | 324/244.1 |
| 5,280,173 | 1/1994 | Morse et al. | 250/227.23 |
| 5,485,079 | 1/1996 | Itoh | 324/96 |

*Primary Examiner*—Ernest F. Karlsen
*Assistant Examiner*—Russell M. Kobert
*Attorney, Agent, or Firm*—Beveridge, DeGrandi, Weilacher & Young,LLP

[57] ABSTRACT

An optical magnetic-field sensor has: a GRIN rod lens; optical fiber for incident light and optical fiber for outgoing light, which are arranged on one end of the GRIN rod lens; first and second reflection mirrors both being on the other end of the GRIN rod lens; and a magneto-optical crystal between the first and the second reflection mirrors, wherein light leaving the optical fiber for incident light is converted into convergent light by the GRIN rod lens, the convergent light is reflected by the first reflection mirror so that an optical axis of the convergent light is substantially vertical to the central axis of the GRIN rod lens, and that the convergent light is focused on the central axis of the GRIN rod lens, the reflected light passes through the central axis and is converted into divergent light, the divergent light is then reflected by the second reflection mirror which is placed at a position being symmetrical with the first reflection mirror, relative to the central axis, the reflected divergent light is converted into convergent light by the GRIN rod lens again to be fed into the optical fiber for outgoing light.

27 Claims, 9 Drawing Sheets

APPLIED ELECTRIC CURRENT: 200 A

OPTICAL FIBER MAGNETIC-FIELD SENSOR

BACKGROUND OF THE INVENTION

1. Field of the invention

The invention concerns an optical magnetic-field sensor for measuring magnetic field intensity by using a magneto-optical crystal having the Faraday effect.

2. Description of the Related Art

In order to measure electric current flowing through an electric line, particularly in an electric power field, an electric current measuring apparatus using optical fibers and a magneto-optical crystal having the Faraday effect, for measuring magnetic field intensity generated around the electric line is being put into practical use.

A method of measuring magnetic field intensity around an electrical conductor through which an electric current is flowing, in order to determine the electric current, has advantages of good electrical insulation became light is used as a medium and no negative effect of electromagnetic induction noises are suffered. Accordingly, application of the method for electric power transmission and distribution installations is being examined.

FIG. 6 is a view showing a principle of a method for measuring a magnetic field by using the Faraday effect. In FIG. 6, a magneto-optical crystal 5 is placed in a generated magnetic field H, and light which has been polarized by a polarizer 4 enters the magneto-optical crystal 5. The polarization plane of the light which entered the magneto-optical crystal 5 is subject to a rotation θ in proportion to the magnetic field intensity H according to the Faraday effect. The linearly polarized light which has been subjected to rotation passes through an analyzer 6 which is arranged to change the polarization direction of the transmitted polarized light to the polarizer 4 by 45°. The intensity of the light passed through the analyzer 6 is proportional to the Faraday rotation angle θ. Accordingly a change in electric current can be detected as a change of intensity light.

A previous optical fiber magnetic-field sensor type will now be discussed. FIG. 7 provides a view of a prior art optical fiber magnetic-field sensor construction (National Technical Report, Vol. 36, No. 2, p127 (1992)). In FIG. 7, reference numbers 20 and 70 denote lenses, a reference number 4 a polarizer, 5 a magnetic optical crystal, 6 an analyzer, 60 a total reflection mirror, and a reference number 90 optical fibers. As the polarizer 4 and analyzer 6 both use cubic polarization beam splitters having an edge of 5 mm, the total reflection mirror 60 is also a cubic having a 5 mm edge.

An operations explanation of the optical fiber magnetic-field sensor constructed as above follows. Incident light (a) entering the optical fibers 90 is made parallel by the lens 20 and is linearly polarized by the polarizer 4. Then the linearly polarized light is transmitted through the magnetic optical crystal 5 and the analyzer 6, both arranged to change the polarization direction of transmitted polarized light the polarizer 4 by 45°. The light is reflected by the total reflection mirror 60 and enters the optical fiber 90 via the lens 70 to be transmitted as outgoing light (b). The polarization plane of the light which entered the magneto-optical crystal 5 is subjected to the rotation in proportion to intensity H of an applied magnetic field (namely, a magnetic field transmitted through the magneto-optical crystal 5 in accordance with the Faraday effect, and it passes through the analyzer 6. Since the intensity of the light which has passed through the analyzer 6 is proportional to the rotation angle θ, a change in electric current can be detected as a change in light intensity. FIG. 8 illustrates the case where an electric current which flows through an electric line and is measured using such an optical fiber magnetic-field sensor. An optical fiber magnetic-field sensor 24 is placed in the gap of a core 29, which is penetrated by an electric line 30, and light from a light source 25 enters the optical fiber magnetic-field sensor 24 via optical fiber 26. Based on the above-mentioned principle, the light intensity, which was changed in proportion to the change in a magnetic field generated in the gap, is measured by an optical detector 27 via the optical fiber 26, to then be proceed in a signal processing electric circuit 28 by electric current measurement.

It is generally accepted that in the case where an optical fiber magnetic-field sensor is placed in a core gap, to measure electric current by detecting a magnetic field generated in the gap, the narrower the gap width is, the larger the generated magnetic field becomes. The result is that the total sensitivity of the optical fiber magnetic-field sensor is enhanced, contrary to the fact that, when the width is broad, it is difficult to avoid the adverse effect of a peripheral magnetic field, rendering it is impossible to precisely measure the magnetic field generated by the electric current through the electric line.

FIGS. 9(a) and 9(b) show the relationship between the width of the core gap and the intensity of the magnetic field generated in the gap. In FIG. 9(a), electric current which flows through the electric line 30 is represented by I, core's gap width 29 is represented by Lg, and Hg represents the intensity of the magnetic field generated in the gap.

The following equation is satisfied:

$$Hg = (I/Lg) \times 4\pi \times 10^{-3} \quad (1)$$

For example, when I=200 A, and Lg=20 mm (0.02 m), the generated magnetic field is 125.7 Oe. FIG. 9(b) provides calculation results of the equation (1) in the case of an applied electric current of 200 A.

As shown in FIG. 7, to arrange the optical fiber magnetic-field sensor in a direction where the magnetic field in the core gap is transmitted through the magneto-optical crystal, it is necessary to have a gap width of at least 15 mm, which is a distance from the polarizer 3 to the total reflection mirror 60. As a consequence it is difficult to obtain a highly-sensitive and precise results.

SUMMARY OF THE INVENTION

Hence an objective of the present invention is to solve the above-mentioned problems and allow an optical fiber magnetic-field sensor with higher sensitivity and precision by making the core gap width as narrow as possible.

In order to achieve the objective, the invention provides an optical fiber magnetic-field sensor comprised of:

a graded index rod lens (hereinafter described as GRIN rod lens);

optical fibers for incident light and outgoing light, respectively, the optical fibers being arranged at one edge of the GRIN rod lens surface;

first and second means of reflection both on the other side of the GRIN rod lens; and a magneto-optical crystal between the first and the second means of reflection.

Such construction makes it possible to arrange optical components constituting an optical fiber magnetic-field sensor within the GRIN rod lens diameter. When the optical fiber magnetic-field sensor is arranged in a direction where a magnetic field in a core gap transmits through a magneto-optical crystal in the optical fiber magnetic-field sensor, the core gap width my be about of the GRIN rod lens diameter, resulting in making it possible to attain a core gap width as narrow as possible and to achieve an optical fiber magnetic-field sensor with a higher sensitivity and a higher precision.

BRIEF DESCRIPTION OF THE DRAWINGS

FIG. 1 is a view of the construction of an optical fiber magnetic-field sensor of an embodiment of;

DETAILED DESCRIPTION OF THE PREFERRED EMBODIMENTS

An embodiment of the invention will be further described below with reference to drawings.

Figure 1:
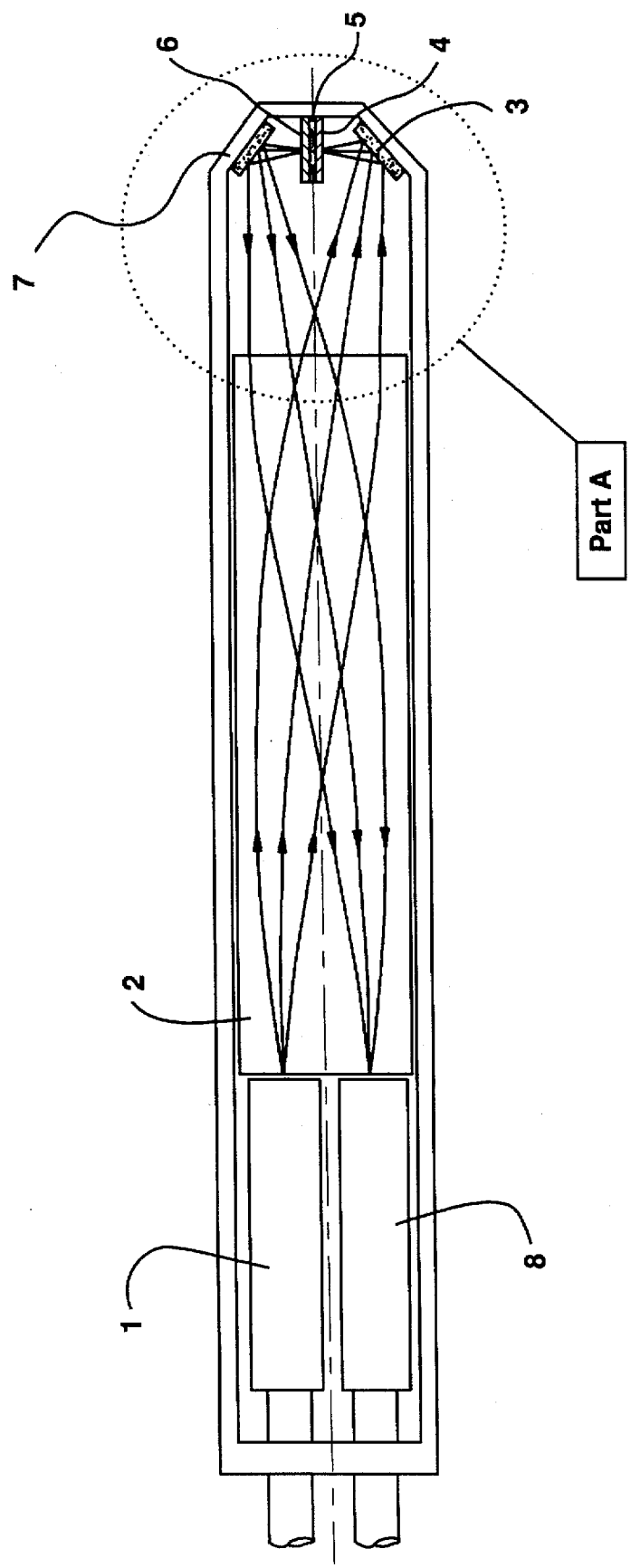
Figure 2:
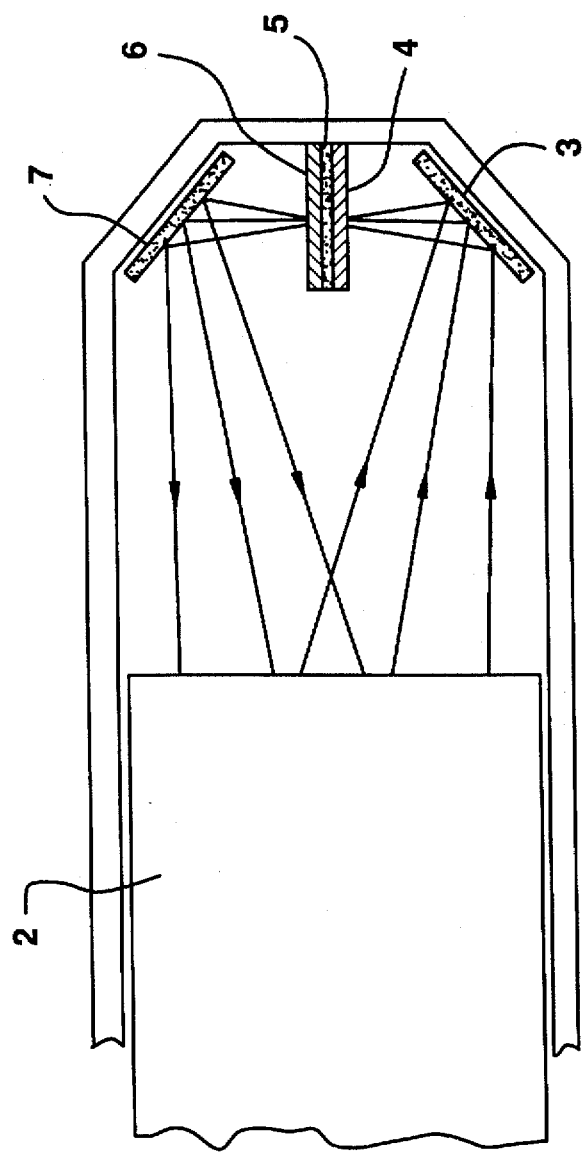
FIG. 2 is an enlarged view of essential construction of the optical fiber magnetic-field sensor (FIG. 1)

FIG. 1 is a construction view of an embodiment of the invention. FIG. 2 is an enlarged view of an essential part shown in FIG. 1 (part A in FIG. 1). In FIG. 1 reference number 1 denotes an incident light optical fiber, a number 2 a GRIN rod lens, number 3 a first total reflection mirror, number 4 a polarizer, number 5 a magneto-optical crystal, number 6 an analyzer, number 7 a second total reflection mirror, number 8 an outgoing light optical fiber.

The incident light and outgoing light optical fibers 1 and 8 are arranged on one edge of the GRIN rod lens 2 so that light outgoing from the incident light optical fiber 1 is converted into convergent light such as ray of light shown in FIG. 1, by the GRIN rod lens 2. The convergent light is reflected by the first total reflection mirror 3 so that the optical axis of the convergent light is nearly vertical to the central axis of the GRIN rod lens 2 and the convergent light is focused on the central axis of the GRIN rod lens 2.

Next, the convergent light passes through the central axis of the GRIN rod lens 2 and is converted into divergent light, which is reflected by the second total reflection mirror 7 placed at a position symmetrical with the first total reflection mirror 3 with respect to the central axis of the GRIN rod lens 2. The divergent light is converted into convergent light as such light line shown in FIG. 2, by the GRIN rod lens 2 again before entering the outgoing light optical fiber 8. This constitutes the optical system. Additionally, the magneto-optical crystal 5 is placed at such position where the light reflected by the first total reflection mirror 3 is converged on the central axis of the GRIN rod lens 2. The reflected light is converged is positioned at or near the center of the magneto-optical crystal 5. The polarizer 4 is located between the first total reflection mirror 3 and the magneto-optical crystal 5. The analyzer 6 has a transmission polarization direction different by 45° from that of the polarizer 4 and is located between the magneto-optical crystal 5 and the second total reflection mirror 7. A magnetic field is thus measured by arranging the optical fiber magnetic-field sensor in a direction where the magnetic field to be measured passes through the magnetic-optical crystal 5. A polarizer 4, magneto-optical crystal 5 and analyzer 6 may be arranged in the order mentioned above between the first total reflection mirror 3 and the second total reflection mirror 7. It is also allowed to pre-fabricate the polarizer 4, magneto-optical crystal 5 and analyzer 6 as one body in consideration of workability in manufacturing.

In order to convert the light outgoing from the GRIN rod lens 2 into convergent light, it is necessary to select a meandering cycle (pitch) of light in the GRIN rod lens 2.

Figure 10:
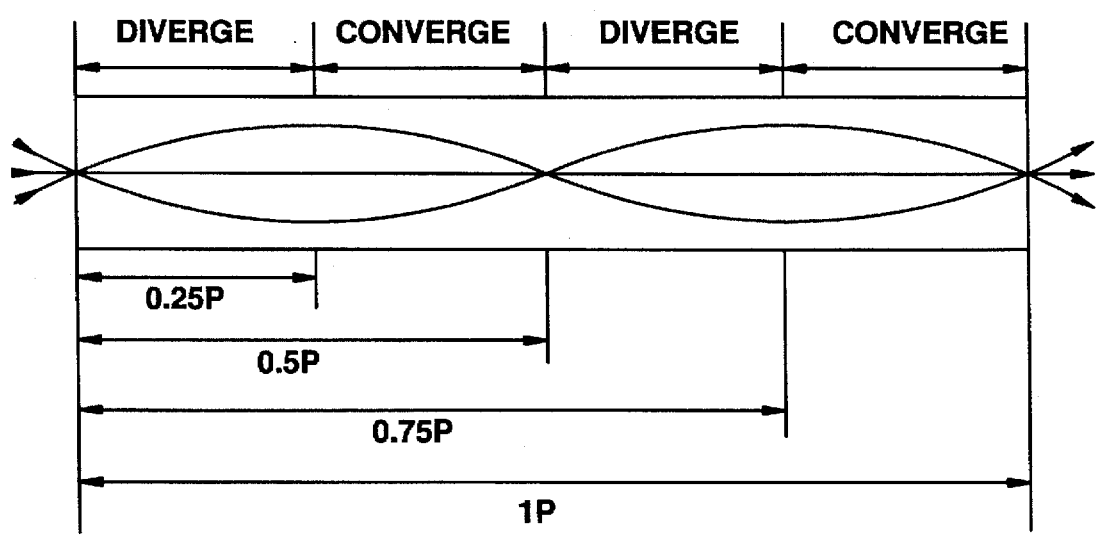
FIG. 10 explains a meandering cycle of a GRIN rod lens.

The meandering pitch indicates, as shown in FIG. 10, one cycle in the case where light which has entered a rod lens travels in the lens while divergence and convergence of the light are repeated. In FIG. 10, the incoming light diverges from 0 P to 0.25 P, converges from 0.25 P to 0.5 P, diverges from 0.5 P to 0.75 P and converges from 0.75 P to 1 P.

Generally, the distance R2 from the central axis of a GRIN rod lens to the position of the light going out from the GRIN rod lens, and the angle θ2 of the outgoing light are defined by the following equations:

$$R2 = R1 \cdot \cos(A \cdot Z) + \theta 1 \cdot (1/NO \cdot A) \cdot \sin(A \cdot Z)$$

$$\theta 2 = -R1 \cdot NO \cdot A \cdot \sin(A \cdot Z) + \theta 1 \cdot \cos(A \cdot Z) \quad (2)$$

Here Z represents the length of the GRIN rod lens, NO the refractive index on the central axis of the GRIN rod lens, A the refractive index distribution constant of the GRIN rod lens, R1 the distance from the central axis of the GRIN rod lens to an incidence position of the light incoming to the GRIN rod lens, and θ1 the incidence angle of the incoming light.

The following will describe an embodiment where a 2 mm diameter GRIN rod lens used for 830 nm wavelength, a meandering cycle of light in a lens of 0.35 P, a refractive index distribution constant of 0.243, and a central axis refractive index of 1.557 are used. The length Z of the GRIN rod lens is obtained by the following equation:

$$Z = (P \times 2\pi)/A \quad (3)$$

P represents designates a meandering cycle of light in a lens, and accordingly the length Z of the GRIN rod lens is 9 mm.

The GRIN rod lens 2 is located so that the central axis of the incident light optical fiber 1 is positioned 0.5 mm from at the central axis of the incident light edge surface of the GRIN rod lens 2. A half angle of spread incident light to the GRIN rod lens 2 is about 0.21 rad. And according to equation (2), the outgoing angle of the optical axis from the GRIN rod lens 2 is about −8.84°, in FIG. 1, outgoing angles of the upper and lower spread light from the GRIN rod lens 2 are about −15.8° and −1.9°, respectively, and then it is apparent the light is convergent light. Accordingly, by directing attention to the outgoing angle of the lower spread light and setting the outgoing angle of the lower spread light to about 0°, it is possible to arrange the first total reflection mirror 3 and the second total reflection mirror 7 so that their distances from the GRIN rod lens 2 central axis exist within the radius of the GRIN rod lens 2. Thereby the magneto-optical crystal 5, the polarizer 4 and the analyzer 6 can be also arranged within the radius of the GRIN rod lens 2, and the width of an optical fiber magnetic-field sensor portion to be installed in a gap of core 29 can be within the diameter of the GRIN rod lens 2.

Although the embodiment is described in relation to the GRIN rod lens of 0.35 P, the outgoing light from the GRIN rod lens 2 can be converted into convergent light by using a GRIN rod lens having a pitch within the following range:

$$0.25 < P < 0.5$$

wherein P is a meandering cycle (pitch) of light in the GRIN rod lens.

More generally the range of P can be defined as follows:

$$0.25 + 0.5\ n < P < 0.5 + 0.5\ n\ (n:\ 0, 1, 2, 3, \ldots)$$

That is, it is necessary that the length of the GRIN red lens exists within a range where the light converges, and, for example, in the case where n=0, when $0.25 \geq P$ or $0.5 \leq P \leq 0.75$, the light will diverge.

In the case where n is increased, it is possible to provide a part of the GRIN rod lens with a function as a light transmission path.

Figure 3:
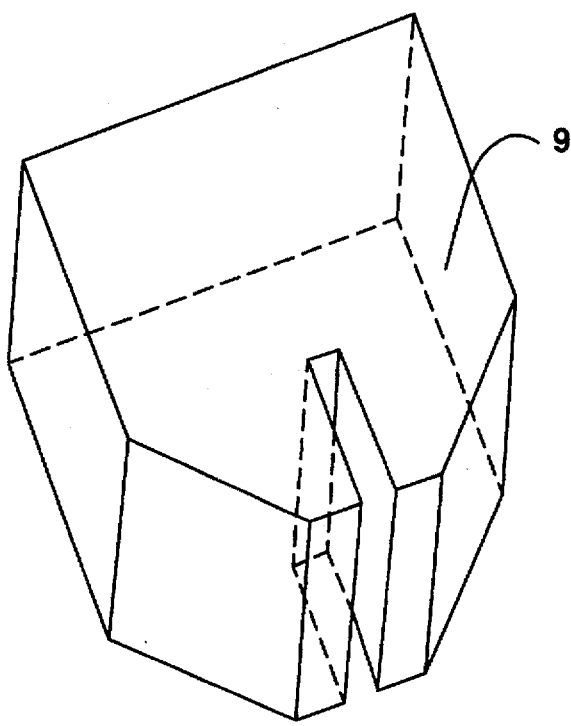
FIG. 3 is a schematic view of a transparent block body used in an embodiment of the invention.
Figure 4:
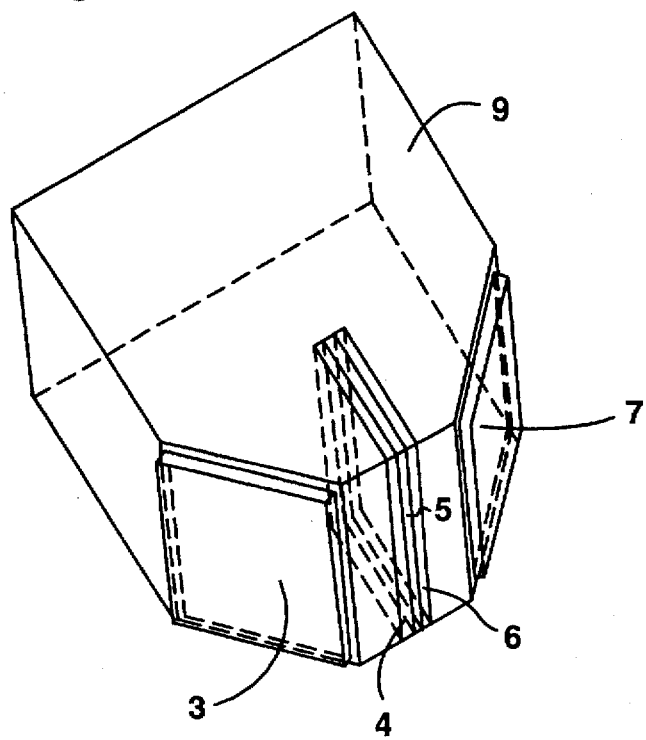
FIG. 4 is a view of an arrangement of essential parts in the transparent block body.
Figure 5:
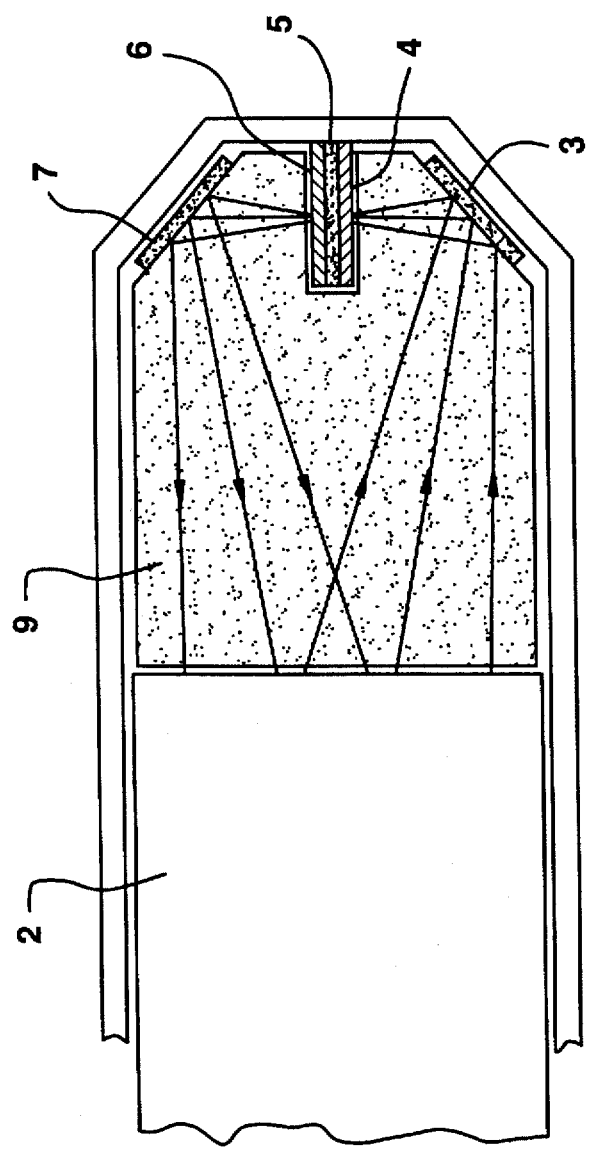
FIG. 5 is an enlarged view of the key part of an optical fiber magnetic-field sensor using a transparent block body.
Figure 6:
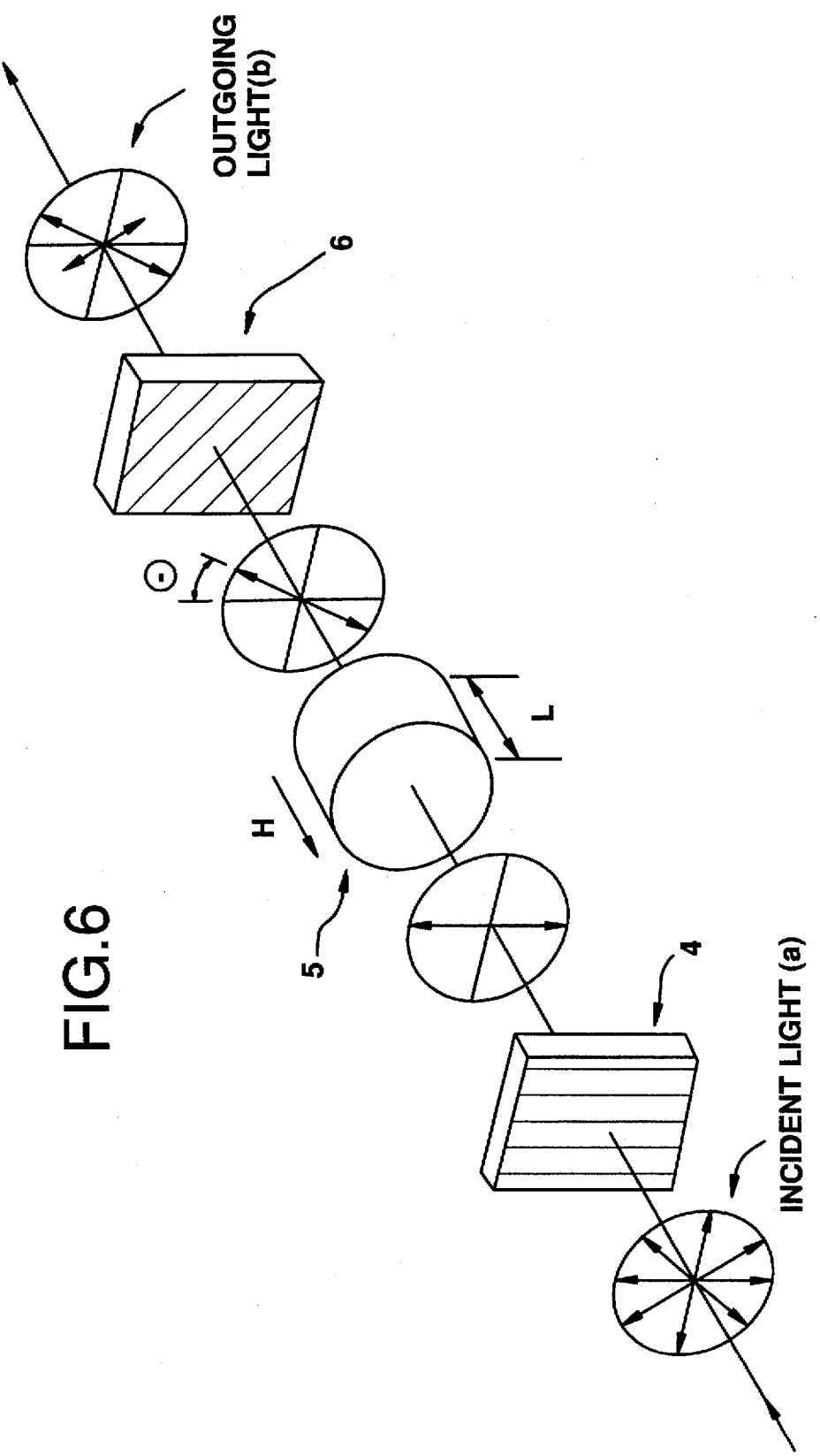
FIG. 6 is a view of a principle of an optical fiber magnetic-field sensor.
Figure 7:
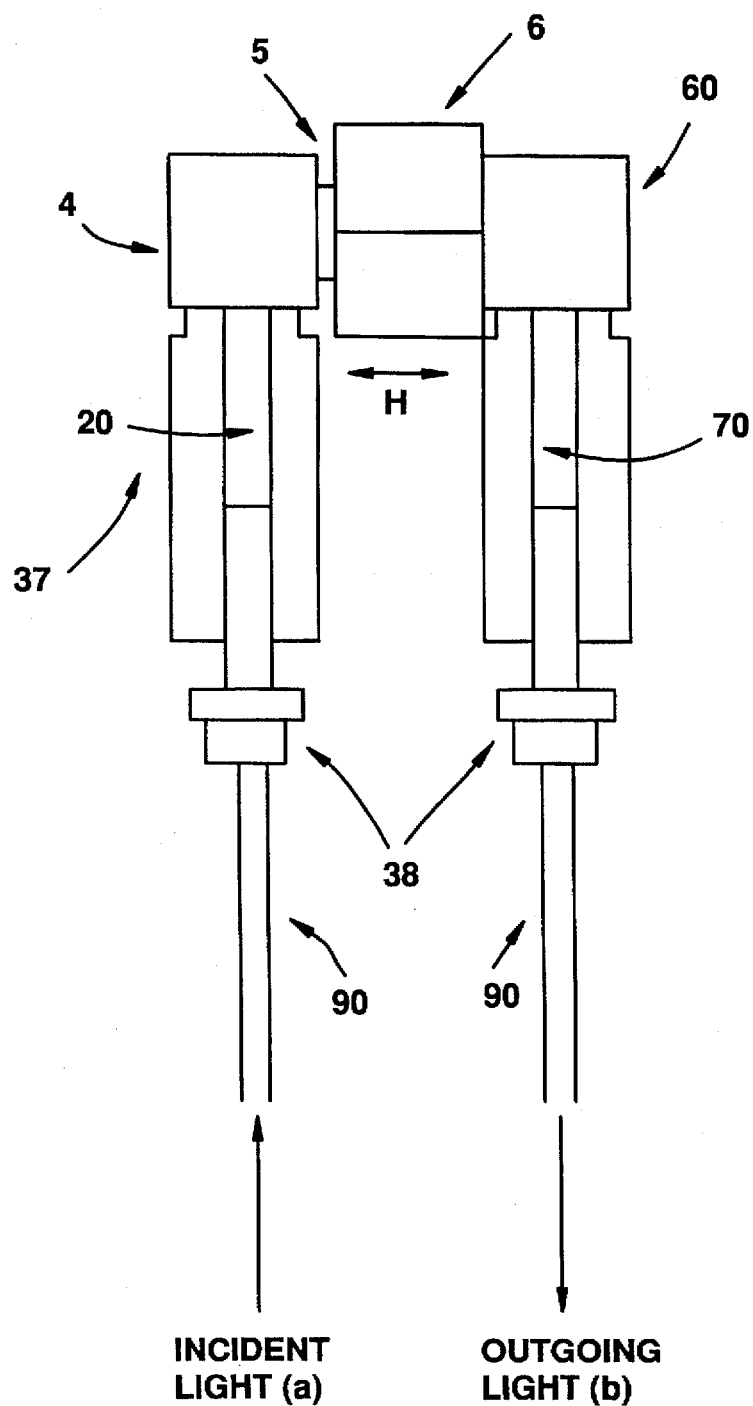
FIG. 7 shows the construction of a prior art optical fiber magnetic-field sensor.
Figure 8:
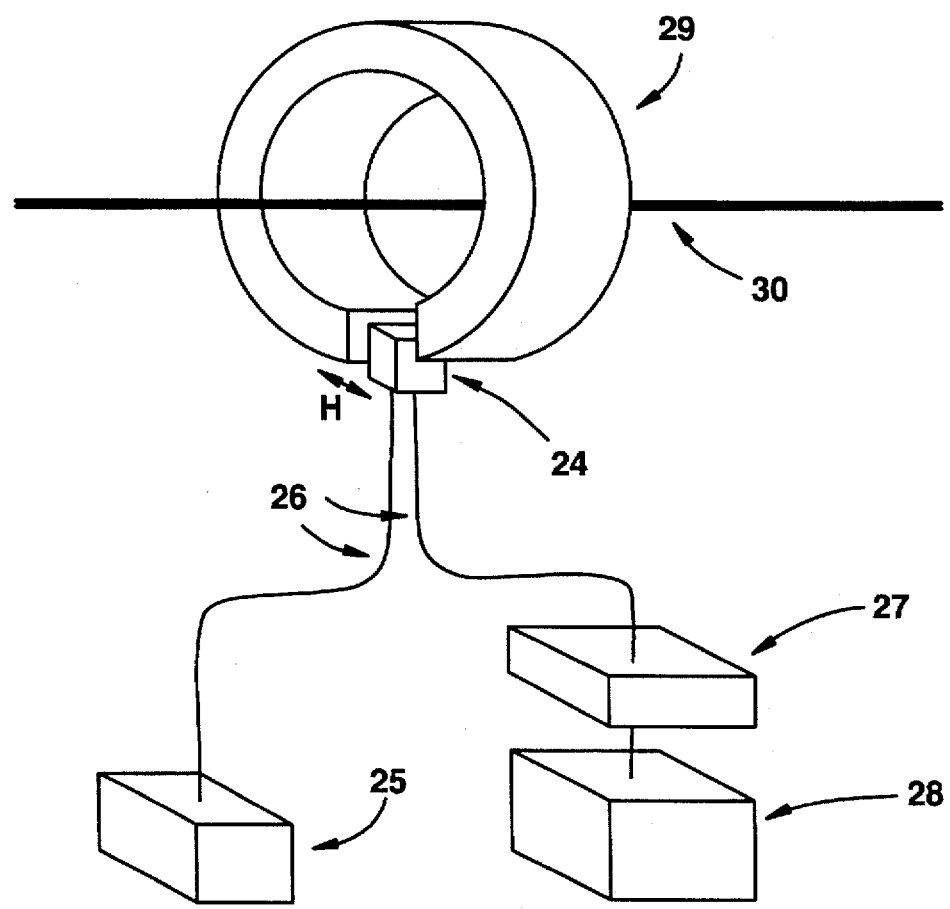
FIG. 8 provides a method of measuring an electric current using an optical fiber magnetic-field sensor.
Figure 9A:
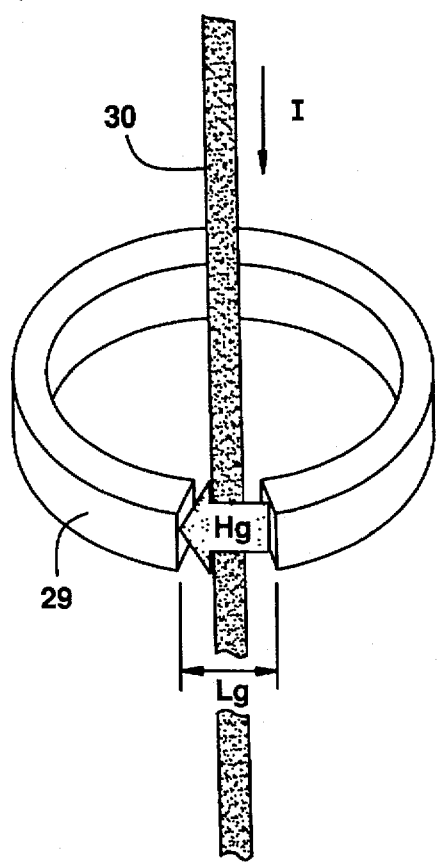
FIGS. 9(a) and 9(b) are diagrams showing a relationship between the core gap width and the generated magnetic field.
Figure 9B:
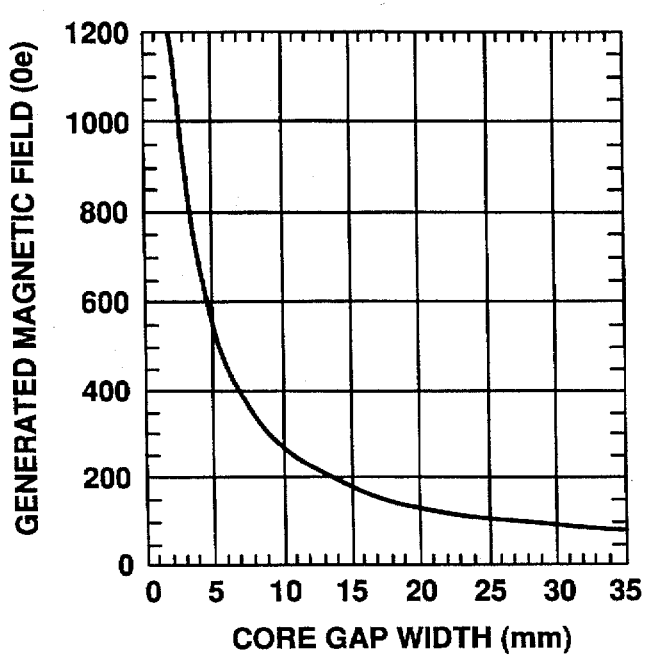

The manufacturing of such sensor is made relatively easy by preparing a transparent block body 9 as shown in FIG. 3, and as shown in FIG. 4, arranging the first total reflection mirror 3, polarizer 4, magneto-optical crystal 5, analyzer 6, and the second total reflection mirror 7 in predetermined positions at predetermined angles to connect to the GRIN rod lens. FIG. 5 shows an enlarged view of an essential part of an optical fiber magnetic-field sensor using the transparent block body 9, and as above, a desired effect is achieved by this optical fiber magnetic-field sensor.

In order to have a small refraction angle of light, it is preferable that the transparent block body 9 has about the same refractive index as that of the center part of the GRIN rod lens. In FIG. 4, a gap is shown between the GRIN rod lens and the transparent block body 9. However, the GRIN rod lens and the transparent block body 9 are affixed using an adhesive having about the same refractive index as that of the transparent block body 9. This step is carried out for the purpose of supressing the reflection and refraction of light. Since it is impossible that each has exactly the same refractive index, the respective sizes are determined by the light tracking method in order to further reduce micro errors.

By using the transparent block body 9 in the manner mentioned above, positioning of the first and second total reflection mirrors, the magneto-optical crystal etc. in mounting can be easily carried out. It is also possible to form the total reflection mirrors on a surface of the transparent block body by vaporization, plating and the like.

As mentioned above, according to the embodiment of the invention, the incident light and outgoing light optical fibers are each arranged on one surface of the GRIN rod lens, so that the light going out from the incident light optical fiber is converted into convergent light by GRIN rod lens. The convergent light is reflected by the first total reflection mirror so that the optical axis of the convergent light is nearly vertical to the central axis of the GRIN rod lens and so that the convergent light is focused on the central axis of the GRIN rod lens. The convergent light passes the central axis of the GRIN rod lens and is converted into divergent light, which is reflected by the total reflection mirror placed at a position symmetrical with the first means of reflection with respect to the GRIN rod lens central axis. Said reflected light is converted into convergent light by the GRIN rod lens again, to construct an optical system which leads the light into the outgoing light optical fiber. The magneto-optical crystal is placed so that the light reflected by the first total reflection mirror converges on the central axis of the GRIN rod lens and that the position of the central axis of the GRIN rod lens where the reflected light is converged is positioned at or near the center of the magneto-optical crystal. A polarizer is between the means of first reflection and the magneto-optical crystal, and an analyzer having a transmission polarization direction differing by 45° from that of the polarizer is located between the magneto-optical crystal and the second total reflection mirror. The polarizer, the magneto-optical crystal, and analyzer are arranged as one body, and a GRIN rod lens has a pitch within the following range:

$$0.25 < P < 0.5$$

wherein P is a meandering cycle (pitch) of light in the GRIN rod lens. The magneto-optical crystal polarizer, analyzer, the first total reflection mirror, and the second reflection mirror are arranged so that the distances from the central axis of the GRIN rod lens exist within the radius of the GRIN rod lens. By arranging and fixing the first total reflection mirror, the polarizer, the magneto-optical crystal, the analyzer and the second total reflection mirror at a predetermined position of the transparent block body so that the light leaving the GRIN rod lens is reflected by the first total reflection mirror. It is then transmitted to the polarizer, the magneto-optical crystal and the analyzer, is reflected by the second total reflection mirror, and converges into the outgoing light optical fiber via the GRIN rod lens. It is possible to arrange optical components constituting the optical fiber magnetic-field sensor within the diameter of the GRIN rod lens. The core gap width, in the case of the optical fiber magnetic-field sensor arranged in a direction where the magnetic field in the core gap is transmitted through the magneto-optical crystal in the optical fiber magnetic-field sensor, can be nearly equal to the diameter of the GRIN rod lens. Thereby the core gap width can be as narrow as possible, resulting in an optical fiber magnetic-field sensor with higher sensitivity and higher precision.

In the aforementioned embodiment, the polarizer 4 is between the first total reflection mirror 3, as the first means of reflection, and the magneto-optical crystal 5. The analyzer 6 is positioned between the magneto-optical crystal 5 and the second total reflection mirror 7, as the second means of reflection. However, alternative arrangements are possible as long as the polarizer 4 is located on the side of the magneto-optical crystal where light comes in, namely between the portion of the GRIN rod lens 2 where light goes out and the magneto-optical crystal 5, and the analyzer 6 is arranged on the side of the magneto-optical crystal where light exits, namely between the portion of the GRIN rod lens 2 where light enters and the magneto-optical crystal 5.

Additionally, in the aforementioned embodiment configuration, the light which has come from the incident light optical fiber 1 and into the GRIN rod lens 2 intersects with light from the second total reflection mirror 7 which has also entered the GRIN rod lens 2. However, it is possible as an alternative to arrange the first total reflection mirror 3, the second total reflection mirror 7, the polarizer 4 and the analyzer 6 adversely with respect to the central axis of the magneto-optical crystal 5 so that the light entering the GRIN rod lens 2 from the incident light optical fiber 1 from the second total reflection mirror 7 does not intersect in the GRIN rod lens 2, but remains parallel. Although this arrangement needs a little bit larger diameter GRIN rod lens 2, the core gap can be narrower than the conventional method.

As apparent from the above, the invention allows optical components constituting the optical fiber magnetic-field sensor to be arranged within the diameter of the GRIN rod lens. If optical fiber magnetic-field sensor is arranged in a direction where a magnetic field in a core gap transmitted to a magneto-optical crystal in the optical fiber magnetic-field sensor, the core gap width can be nearly equal to the diameter of the GRIN rod lens, making it possible to attain an optimally narrow core gap width and achieve an optical fiber magnetic-field sensor of a higher sensitivity and a higher precision.

Additionally, since there are no negative effects of unnecessary environmental magnetic fields due to a narrowed core gap width, higher precision measurement is possible.

What is claimed is:

1. An optical magnetic-field sensor comprising:
    a GRIN rod lens;
    optical fiber for incident light and optical fiber for outgoing light, which are arranged on one end of the GRIN rod lens;
    first and second reflection means both being on the other end of the GRIN rod lens; and
    a magneto-optical crystal between the first and the second reflection means, wherein
    light leaving the optical fiber for incident light is converted into convergent light by the GRIN rod lens,
    the convergent light is reflected by the first reflection means so that an optical axis of the convergent light is substantially vertical to the central axis of the GRIN rod lens, and that the convergent light is focused on the central axis of the GRIN rod lens,
    the reflected light passes through the central axis and is converted into divergent light,
    the divergent light is then reflected by the second reflection means which is placed at a position being symmetrical with the first reflection means, relative to the central axis,
    the reflected divergent light is converted into convergent light by the GRIN rod lens again to be fed into the optical fiber for outgoing light.

2. The optical magnetic-field sensor according to claim 1, wherein
    a center position of the magneto-optical crystal corresponds to the position of the central axis of the GRIN rod lens where the light reflected by the first reflection means converges, and
    a polarizer is on the side of the magneto-optical crystal where light enters, and an analyzer having a transmission polarization direction different from that of the polarizer is located on the side of the magneto-optical crystal where light goes out.

3. The optical magnetic-field sensor according to claim 2, wherein
    the polarizer is between the first reflection means and the magneto-optical crystal, and
    the analyzer is between the second reflection means and the magneto-optical crystal.

4. The optical magnetic-field sensor according to claim 2, wherein
    the transmission polarization directions of the polarizer and the analyzer differ by substantially 45°.

5. The optical magnetic-field sensor according to claim 3, wherein
    the transmission polarization directions of the polarizer and the analyzer differ by substantially 45°.

6. The optical magnetic-field sensor according to claim 1, wherein
    the polarizer, the magneto-optical crystal and the analyzer are configured as one body.

7. The optical magnetic-field sensor according to claim 5, wherein
    the polarizer, the magneto-optical crystal and the analyzer are configured as one body.

8. The optical magnetic-field sensor according to claim 2, wherein
    the polarizer, the magneto-optical crystal and the analyzer are configured as one body.

9. The optical magnetic-field sensor according to claim 3, wherein
    the polarizer, the magneto-optical crystal and the analyzer are configured as one body.

10. The optical magnetic-field sensor according to claim 4, wherein
    the polarizer, the magneto-optical crystal and the analyzer are configured as one body.

11. The optical magnetic-field sensor according to claim 1, wherein
    the GRIN rod lens has a pitch of the following range:

$$0.25 + 0.5\ n < P < 0.5 + 0.5\ n\ (n: 0, 1, 2, 3, \ldots)$$

wherein P is a meandering cycle (pitch) of light in the GRIN rod lens.

12. The optical magnetic-field sensor according to claim 5, wherein the GRIN rod lens has a pitch, of the following range:

$$0.25 + 0.5\ n < P < 0.5 + 0.5\ n\ (n: 0, 1, 2, 3, \ldots)$$

wherein P is a meandering cycle (pitch) of light in the GRIN rod lens.

13. The optical magnetic-field sensor according to claim 2, wherein the GRIN rod lens has a pitch of the following range:

$$0.25 + 0.5\ n < P < 0.5 + 0.5\ n(n: 0, 1, 2, 3, \ldots)$$

wherein P is a meandering cycle (pitch) of light in the GRIN rod lens.

14. The optical magnetic-field sensor according to claim 3, wherein the GRIN rod lens has a pitch of the following range:

$$0.25 + 0.5\ n < P < 0.5 + 0.5\ n(n: 0, 1, 2, 3, \ldots)$$

wherein P is a meandering cycle (pitch) of light in the GRIN rod lens.

15. The optical magnetic-field sensor according to claim 4, wherein the GRIN rod lens has a pitch of the following range:

$$0.25 + 0.5\ n < P < 0.5 + 0.5\ n(n: 0, 1, 2, 3, \ldots)$$

wherein P is a meandering cycle (pitch) of light in the GRIN rod lens.

16. The optical magnetic-field sensor according to claim 5, wherein the GRIN rod lens has a pitch of the following range:

$$0.25 + 0.5\ n < P < 0.5 + 0.5\ n(n: 0, 1, 2, 3, \ldots)$$

wherein P is a meandering cycle (pitch) of light in the GRIN rod lens.

17. The optical magnetic-field sensor according to claim 2, wherein
the first and second reflection means, the polarizer, the magneto-optical crystal and the analyzer are arranged so that distances of these elements from the central axis of the GRIN rod lens exist within a radius of the GRIN rod lens respectively.

18. The optical magnetic-field sensor according to claim 5, wherein
the first and second reflection means, the polarizer, the magneto-optical crystal and the analyzer are arranged so that distances of these elements from the central axis of the GRIN rod lens exist within a radius of the GRIN rod lens respectively.

19. The optical magnetic-field sensor according to claim 3, wherein
the first and second reflection means, the polarizer, the magneto-optical crystal and the analyzer are arranged so that distances of these elements from the central axis of the GRIN rod lens exist within a radius of the GRIN rod lens respectively.

20. The optical magnetic-field sensor according to claim 4, wherein
the first and second reflection means, the polarizer, the magneto-optical crystal and the analyzer are arranged so that distances of these elements from the central axis of the GRIN rod lens exist within a radius of the GRIN rod lens respectively.

21. The optical magnetic-field sensor according to claim 5, wherein
the first and second reflection means, the polarizer, the magneto-optical crystal and the analyzer, are arranged so that distances of these elements from the central axis of the GRIN rod lens exist within a radius of the GRIN rod lens respectively.

22. The optical magnetic-field sensor according to claim 2, wherein
a transparent block body is provided for affixing the first reflection means, the polarizer, the magneto-optical crystal, the analyzer and the second reflection means in predetermined positions so that the light leaving the GRIN red lens is reflected by the first reflection means, is transmitted to the polarizer, the magneto-optical crystal and the analyzer, is then reflected by the second reflection means and enters the GRIN rod lens.

23. The optical magnetic-field sensor according to claim 5, wherein
a transparent block body is provided for affixing the first reflection means, the polarizer, the magneto-optical crystal, the analyzer and the second reflection means in predetermined positions so that the light leaving the GRIN rod lens is reflected by the first reflection means, is transmitted to the polarizer, the magneto-optical crystal and the analyzer, is then reflected by the second reflection means and enters the GRIN rod lens.

24. The optical magnetic-field sensor according to claim 3, wherein
a transparent block body is provided for affixing the first reflection means, the polarizer, the magneto-optical crystal, the analyzer and the second reflection means in predetermined positions so that the light leaving the GRIN rod lens is reflected by the first reflection means, is transmitted to the polarizer, the magneto-optical crystal and the analyzer, is then reflected by the second reflection means and enters the GRIN rod lens.

25. The optical magnetic-field sensor according to claim 4, wherein
a transparent block body is provided for affixing the first reflection means, the polarizer, the magneto-optical crystal, the analyzer and the second reflection means in predetermined positions so that the light leaving the GRIN rod lens is reflected by the first reflection means, is transmitted to the polarizer, the magneto-optical crystal and the analyzer, is then reflected by the second reflection means and enters the GRIN rod lens.

26. The optical magnetic-field sensor according to claim 5, wherein
a transparent block body is provided for affixing the first reflection means, the polarizer, the magneto-optical crystal, the analyzer and the second reflection means in predetermined positions so that the light leaving the GRIN rod lens is reflected by the first reflection means, is transmitted to the polarizer, the magneto-optical crystal and the analyzer, is then reflected by the second reflection means and enters the GRIN rod lens.

27. The optical magnetic-field sensor according to claim 6, wherein
a transparent block body is provided for affixing the first reflection means, the polarizer, the magneto-optical crystal, the analyzer and the second reflection means in predetermined positions so that the light leaving the GRIN rod lens is reflected by the first reflection means, is transmitted to the polarizer, the magneto-optical crystal and the analyzer, is then reflected by the second reflection means and enters the GRIN rod lens.

* * * * *